United States Patent
Dempster

(10) Patent No.: US 8,972,224 B2
(45) Date of Patent: Mar. 3, 2015

(54) COMPUTER SYSTEMS FOR DATA MANIPULATION AND RELATED METHODS

(75) Inventor: Michael Alan Howarth Dempster, Birmingham (GB)

(73) Assignee: Cambridge Systems Associates Limited, Cambridge (GB)

( * ) Notice: Subject to any disclaimer, the term of this patent is extended or adjusted under 35 U.S.C. 154(b) by 0 days.

(21) Appl. No.: 13/021,670

(22) Filed: Feb. 4, 2011

(65) Prior Publication Data

US 2011/0131023 A1 Jun. 2, 2011

Related U.S. Application Data

(63) Continuation of application No. 11/569,796, filed as application No. PCT/GB2005/002103 on May 27, 2005, now abandoned.

(30) Foreign Application Priority Data

May 29, 2004 (GB) .................................. 0412123.2

(51) Int. Cl.
G06F 17/50 (2006.01)
G06G 7/60 (2006.01)
G06F 7/48 (2006.01)
G06F 13/10 (2006.01)
G06F 11/26 (2006.01)

(52) U.S. Cl.
CPC ............ *G06F 13/105* (2013.01); *G06F 11/261* (2013.01); *G06F 17/50* (2013.01)
USPC .................. 703/2; 703/1; 703/6; 703/7; 703/9

(58) Field of Classification Search
USPC ........................................................ 703/13
See application file for complete search history.

(56) References Cited

U.S. PATENT DOCUMENTS

| | | | | |
|---|---|---|---|---|
| 6,219,649 | B1 * | 4/2001 | Jameson | 705/7.12 |
| 6,625,577 | B1 * | 9/2003 | Jameson | 705/7.25 |
| 6,735,596 | B2 * | 5/2004 | Corynen | 1/1 |
| 6,772,136 | B2 * | 8/2004 | Kant et al. | 706/50 |
| 7,130,779 | B2 * | 10/2006 | Beverina et al. | 703/6 |
| 7,231,327 | B1 * | 6/2007 | Beverina et al. | 703/2 |
| 7,389,209 | B2 * | 6/2008 | Masiello et al. | 703/2 |

(Continued)

OTHER PUBLICATIONS

Dempster et al. "Stochastic Modelling and Optimization using STOCHASTICS", Applications of Stochastic Programming, 2002.*

(Continued)

*Primary Examiner* — Shambhavi Patel
(74) *Attorney, Agent, or Firm* — Fenwick & West LLP

(57) ABSTRACT

A computer system for data management arranged to provide at least four components: a generator component, a solver component, a simulation component and a visualization component, wherein the simulation component is arranged to simulate stochastic processes and output simulation data of the simulated process to the generator component; the generator component is arranged to process a model input thereto and to generate a Dynamic Stochastic Program (DSP) therefrom and also to process the simulation data received from the simulation component and output the DSP together with the processed simulation data to the solver component; the solver component being arranged to receive the DSP and the processed simulation data and to process the DSP together with the simulation data; and the visualization component being arranged to allow the data being processed by the solver to be visualized.

24 Claims, 3 Drawing Sheets

(56) References Cited

U.S. PATENT DOCUMENTS

| | | | |
|---|---|---|---|
| 7,474,995 B2* | 1/2009 | Masiello et al. | 703/2 |
| 7,797,062 B2* | 9/2010 | Discenzo et al. | 700/28 |
| 7,813,822 B1* | 10/2010 | Hoffberg | 700/94 |
| 7,908,197 B2* | 3/2011 | De Prisco et al. | 705/36 R |
| 8,036,974 B2* | 10/2011 | De Prisco et al. | 705/36 R |
| 8,341,180 B1* | 12/2012 | Arumugam et al. | 707/770 |
| 8,458,000 B2* | 6/2013 | Narayanan et al. | 705/7.11 |
| 2004/0059621 A1* | 3/2004 | Jameson | 705/8 |
| 2005/0203643 A1* | 9/2005 | Jackson et al. | 700/51 |
| 2006/0044307 A1* | 3/2006 | Song | 345/419 |
| 2006/0247990 A1* | 11/2006 | Narayanan et al. | 705/35 |
| 2007/0005534 A1* | 1/2007 | Sabato et al. | 706/19 |
| 2007/0087756 A1* | 4/2007 | Hoffberg | 455/450 |
| 2007/0282579 A1* | 12/2007 | Dempster | 703/6 |
| 2010/0235285 A1* | 9/2010 | Hoffberg | 705/75 |

OTHER PUBLICATIONS

Thompson et a. "EVPI-based Importance Sampling Solution Procedures for Multistage Stochastic Linear Programs on Parallel MIMD Architectures", Annals of Operations Research, 1999.*

Dempster et al. "Global Asset Liability Management", 2002.*

Dempster, M.A.H. "Sequential Importance Sampling Algorithms for Dynamic Stochastic Programming", 1999.*

Dupacova, Jitka. "Scenarios for Multistage Stochastic Programs", Annals of Operations Research 100, 25-53, 2000.*

Consigli et al. "Dynamic stochastic programming for asset—liability management", Annals of Operations Research 81(1998)131-161.*

Pflug, G.Ch. "Scenario tree generation for multiperiod financial optimization by optimal discretization", Math. Program., Ser. B 89: 251-271 (2001).*

Gulpmar et a. "Simulation and optimization approaches to scenario tree generation", Journal of Economic Dynamics & Control 28 (2004) 1291-1315.*

Mulvey et al. "Financial planning via multi-stage stochastic optimization", Computers & Operations Research 31 (2004) 1-20.*

Growe-Kruska et al. "Scenario Reduction and Scenario Tree Construction for Power Management Problems", 2003 IEEE Bologna PowerTech Conference, Jun. 23-26.*

European Examination Report, European Application No. 05753138.6, Sep. 27, 2010, 4 pages.

Hibiki, N., "Multi-Period Stochastic Programming Models Using Simulated Paths for Strategic Asset Allocation," Journal of the Operations Research Society of Japan, the Operations Research Society of Japan, Jun. 2001, pp. 169-193, vol. 44, No. 2.

Japanese Office Action, Japanese Patent Application No. 2007-514103, Dec. 16, 2010, 4 pages.

Japanese Office Action, Japanese Patent Application No. 2007-514103, Aug. 18, 2011, 3 pages.

* cited by examiner

COMPUTER SYSTEMS FOR DATA MANIPULATION AND RELATED METHODS

CROSS REFERENCE TO RELATED APPLICATIONS

This application is a continuation of U.S. application Ser. No. 11/569,796, filed Aug. 1, 2007, now abandoned, which is a National Stage Entry of International Application No. PCT/GB05/02103, filed May 27, 2005, which claims the right of priority based on UK Application No. 0412123.2, filed May 29, 2004. Each of the foregoing is incorporated by reference in its entirety.

BACKGROUND

This invention relates to a computer system for data manipulation and in particular, but not exclusively, to a computer system arranged to manipulate data to ascertain future trends. Related methods are also provided.

Linear, and more generally mathematical, programming optimization techniques have been in steady commercial use on the computing systems of the day since the mid 1950s. Sometime in the mid 1970s, independently at both the US Energy Department and the World Bank, the concept of a modelling language for mathematical programming arose.

Representation of a model in such a language is to the numerical optimization of a mathematical program the analogue of what a database management system schema is to a flat file. It is straightforward for the analyst to turn a mathematical description of a model into statements in a modelling language which then communicates directly with the solver—optimization routine.

In the intervening years a variety of sophisticated modelling languages have come into every day use for the creation, solution and modification of large scale deterministic linear, nonlinear and discrete optimization models of practical planning problems.

Dynamic Stochastic Programming (DSP) is a numerical method for solving planning problems that involve uncertainty, now and in the future. Generally, the method involves writing the problem in a mathematical programming language, and passing that program to a suitable solver. However, solving such problems is computationally intensive, making it nigh impossible to solve realistic problems in acceptable time. The present difficulty of the method stems from a number of issues with current DSP tools. It has therefore been a problem to solve such problems involving uncertainty, now and in the future, in an acceptable time or at all. There is a desire to solve such problems in order that predictions about the future can be made. Such predictions are useful for a wide variety of fields including: the supply and demand for energy, oil, or telecommunications bandwidth or in financial markets. Future predictions about the requirement for bandwidth, energy, oil and the like may be useful in determining the size of plant to construct, etc.

There is an issue of how to represent uncertain future states of the world. Generally this is done by simulation: forecasting alternative scenarios for the future. Stochastic programming involves combining all of these alternative scenarios into the Deterministic Equivalent Problem (DEP). Here lies the problem: too few scenarios and the solution is not robust, too many and the problem cannot be solved in reasonable time. This is particularly problematic for DSP in which there are multiple time-steps and the number of scenarios grows geometrically.

The second issue is the choice of a suitable solver: one that is adapted to the nature of the problem. General-purpose solvers attempt to map the entire DEP into memory, which constrains the practitioner to unrealistically simple DSP's or large amounts of memory and computing power would be required to solve DEP of more complexity. The problem thus arises as to how a realistic problem can be solved in reasonable time with the computing power that it is currently readily available.

SUMMARY

According to a first aspect of the invention there is provided a method of managing data to solve a Dynamic Stochastic Programming problem, the method comprising providing a suite of components that allow the DSP to be to be iteratively solved wherein the components comprise a generator component, a solver component, a simulation component and a visualisation component wherein;
  i. the generator component is arranged to generate a Dynamic Stochastic Program (DSP) from a model input thereto and to convert the output of the simulator component for processing by the solver component;
  ii. the solver component being arranged to process the DSP;
  iii. the simulator component being arranged to simulate stochastic processes for processing by the generator component; and
  iv. the visualisation component providing an output of the input model and the results generated by the solver.

An advantage of such a method is that it can improve the efficiency and effectiveness of Dynamic Stochastic Programming (DSP) for real-world planning problems running on equivalent hardware to prior solutions. The components may resolve the hitherto intractable issues of problem size and complexity by supporting stages of an iterative process of finding a robust solution with an integrated set of tools that are specifically designed for each modelling task: simulation, generation, optimization, and visualisation.

It is advantageous that the visualisation component allows both the input model and the results generated by the solver to viewed as this allows a user to ascertain that the solution to the DEP is acceptable. A comparison of the input model and the results generated by the solver allows an iterative process to be performed until a satisfactory solution to the DEP is provided.

The components may be thought of as providing an integrated set of tools for solving real-world planning problems using DSP in an iterative process. Other mathematical programming languages used to solve DSP are single-shot, in that they assume that the program is correctly formulated if it is syntactically correct, and that the solution is correct if it can be calculated at all. Previously any attempt to refine the solution is left to the practitioner to edit and re-run the program.

The method may provide a solution that is arrived at in an iterative process of refinement with different models, scenario structures and simulator data.

The simulation component may provide a plurality of simulators each arranged to simulate a predetermined characteristic. The visualisation component may comprise a plurality of viewers. The method may couple a viewer in the visualisation component with one or more simulators in the simulator component. It may be possible using the visualisation component to identify shortfalls in the solution and re-run the program with appropriate refinements.

In some, perhaps the simplest, embodiments the visualisation component may a viewer that allows a file, which may be a text file, or the like, to viewed. In other embodiments the viewer may be more complex and may provide a graphical interface.

The generator component has a number of advantages at least some of which follow: firstly it allows the formulation of the planning problem to be separated from the structure of the future scenarios. This is revolutionary in the field of stochastic programming, where every other approach has embedded the structure if not the scenarios themselves into the DSP. Such an embedding would otherwise seem inevitable, since the DSP has to be compiled into the DEP so that it can be solved.

The method may allow the scenario structure to be revised iteratively which is advantageous in that it helps to improve the robustness of the solution and the computational efficiency of the solver. In all other approaches that involve embedding the structure into the program it is difficult and tedious to change this structure even once, let alone repeatedly. What was previously hard-coded, is independent and flexible in the generator component of the current method. Thus the stochastic planning problem can be formulated in the stochastic programming language as if it was deterministically dynamic, with little or no reference to the way in which uncertainty is represented in the scenario structure.

Secondly the method may cause the generator component to read the scenarios in a piecewise manner whilst solving the DSP. All other stochastic programming tools generate the DEP in full, even if it is then passed to a decomposition solver. This severely constrains the size of the planning problem that can be solved. Therefore, it is an advantage of the current method that less memory and processing power is required to solve the DSP. This limitation is particularly painful for DSP's where the number of scenarios required to adequately span the future states of the world may be very large indeed. As a consequence other approaches are unable to solve realistic DSP's in acceptable times, if at all.

The method may split the DSP into sub-tasks. Further, the generator component may be caused by the method to read sub-tasks of the DSP into the solver component. This may provide a more efficient use of computing resources, and makes it feasible to parallelize the solution process. This approach is facilitated by the tight coupling of the sub-task solution by the generator and solver components. All other approaches involving a decoupled (third-party) solver are forced to instantiate the DEP in full.

The solver component may utilise any of the following: various adaptations of the nested Benders algorithm appropriate to the DEP structure, with strictly linear constraints, convex non-linear objectives, heuristic aggregation techniques, sequential importance sampling based on the expected value of perfect information, and tight coupling with the generator component (as described above). The benefits of these adaptations are increases both in the speed of solving DSP's and in the scale of the planning problems that can be solved.

Furthermore, the solvers within the solver component may support parallelization across a plurality of processors to further increase the size of problems that can be solved, and the speed of solution. Benchmark tests have shown that the solver component may be ten to one hundred times faster than other solvers, for the types of real-world DSP for which the components has been designed.

The method may allow the visualisation component access to data-structures within the generator component. An advantage of such a method is that a more immediate and interactive interface is possible compared to providing an external viewer; i.e. a viewer that does not have access to the data-structures within the generator component.

It is usual to customise one or more of the viewers within the visualisation component for a particular application, such as displaying an expected financial portfolio composition as it changes over time towards a forecast horizon. The method may allow external viewers with less direct coupling to the components to be used but advantageously these are used once the model has stabilized.

The method may allow the simulator component and/or the visualisation component to be customized for particular applications, or replaced in part by sub-components created specifically for a predetermined task.

The method may also provide a library component which provides a library of routines that may be called by other components. Such a library component facilitates such customization since it allows for efficient interfaces to the functionality and data of the other components. The library component helps to couple the components used by the method making the method more efficient for use on real-world planning problems. The method may separate the scenario structures from the DSP providing for an easier and faster approach to the formulation and solution of problems.

It is common to represent the DSP as a tree in which each node of the tree represents a decision point at which the future must be assessed in terms of alternative simulated scenarios. This tree may be referred to as a scenario tree and a simulated scenario represents one particular path through the tree.

The Stochastics Suite includes several solvers that exploit the nodal structure of the DSP, as expressed in the programming language and in the separate scenario tree structure. These solvers achieve dramatic increases in the speed of solving large problems: ten to one hundred times faster than other general-purpose solvers. Not only does this allow real-world problems to be solved in acceptable times, it facilitates solving complex problems that are otherwise insoluble using other solvers.

According to a second aspect of the invention there is provided a computer system for data management arranged to provide at least four components: a generator component, a solver component, a simulation component and a visualisation component:

wherein the simulator component is arranged to simulate stochastic processes and output simulation data of the simulated process to the generator component;
  the generator component is arranged to process a model input thereto and to generate a Dynamic Stochastic Program (DSP) therefrom and also to process the simulation data received from the simulator component and output the DSP together with the process simulation data to the solver component;
  the solver component being arranged to receive the DSP and the processed simulation data and to process the DSP together with the simulation data; and
  the visualisation component being arranged to allow the data being processed by the solver to be visualised.

According to a third aspect of the invention there is provided a machine readable medium containing instructions which when read onto a computer cause that computer to provide the method of the first aspect of the invention.

According to a fourth aspect of the invention there is provided a machine readable medium containing instructions which when read onto a computer cause that computer to provide the computer system of the second aspect of the invention.

According to a fifth aspect of the invention there is provided a program arranged to solve a Dynamic Stochastic Programming problem, the program providing a suite of components that allow the problem to be to be iteratively solved wherein the components comprise a generator module, a solver module, a simulation module and a visualisation module wherein;

i. the generator module is arranged to generate a Dynamic Stochastic Program (DSP) from a model input thereto and to convert the output of the simulation module for processing by the solver module;

ii. the solver module being arranged to process the DSP;

iii. the simulation module being arranged to simulate stochastic processes for processing by the generator module; and iv. the visualisation module providing an output of the inputs and the results generated by the solver module.

According to a sixth aspect of the invention there is provided a machine readable medium containing instructions provide the program of the fifth aspect of the invention.

The machine readable medium of any of the aspects of the invention may be any of the following non-exhaustive list: a floppy disk, a CD ROM/RAM, a DVD ROM/RAM (including -R/-RW and +R/+RW), a hard drive, a memory, any form of magneto and/or optical disk, a transmitted signal (including an internet download, email, ftp, or the like), a wire.

BRIEF DESCRIPTION OF THE DRAWINGS

There now follows by way of example only a detailed description of the present invention with reference to the accompanying drawings in which.

DETAILED DESCRIPTION

Figure 1:
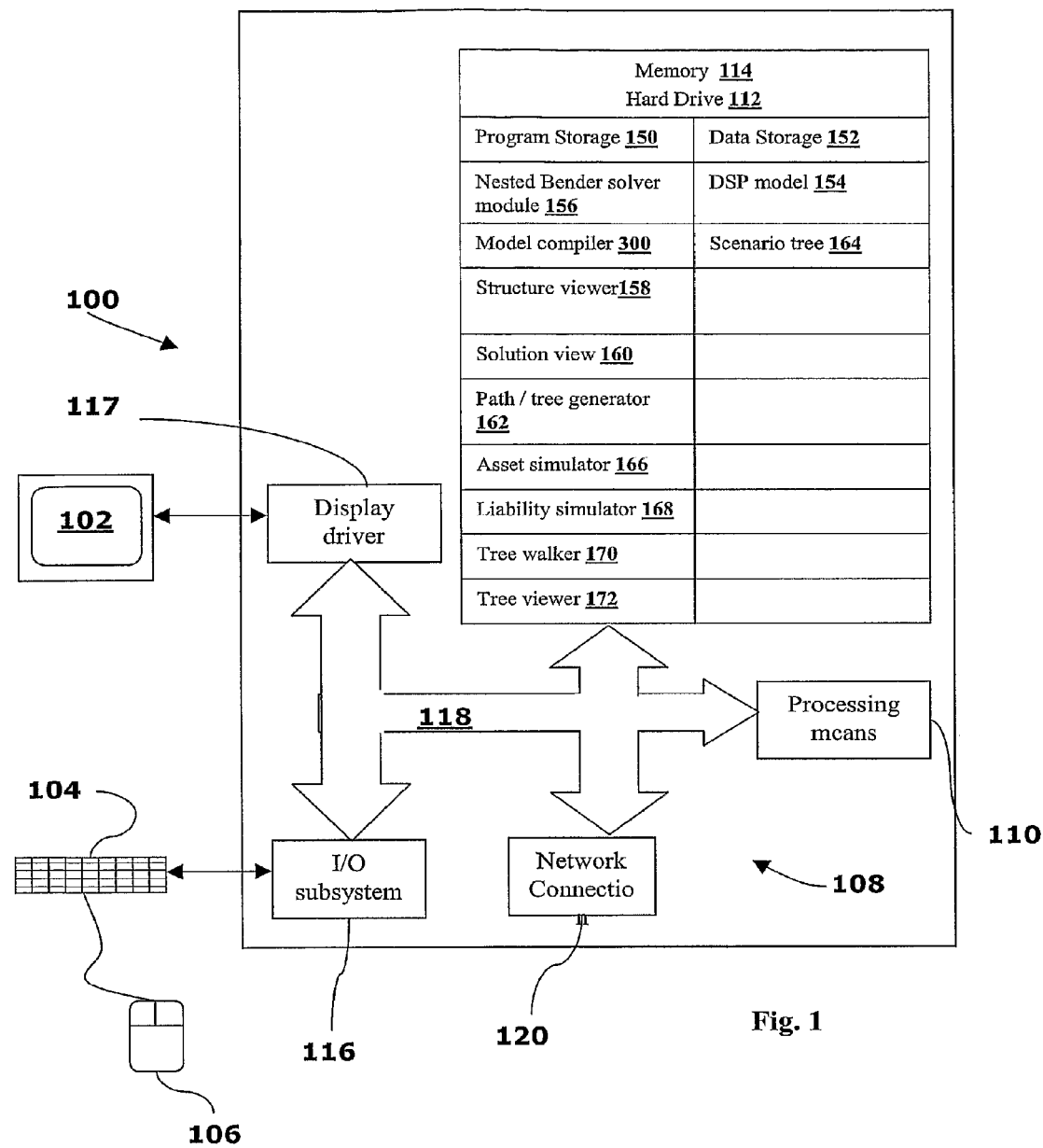
FIG. 1 shows, schematically, a suitable computer system for realising one embodiment of the present invention.

The computer system 100 shown in FIG. 1 comprises a display means 102, in this case an LCD (Liquid Crystal Display) monitor, a keyboard 104, a mouse 106 and processing circuitry 108. It will be appreciated that other display means such as LEP (Light Emitting Polymer), CRT (Cathode Ray Tube) displays, projectors, televisions and the like may be equally possible.

The processing circuitry 108 comprises a processing means 110, a hard drive 112 (containing a store of data), memory 114 (RAM and ROM), an I/O subsystem 116 and a display driver 117 which all communicate with one another, as is known in the art, via a system bus 118. The processing means 110 typically comprises at least one INTELT™ PENTIUM™ series processor, (although it is of course possible for other processors to be used) and performs calculations on data. The other processors may include processors such as the AMD™ ATHLON™, POWERPC™, DIGITAL™ ALPHA™, and the like.

The hard drive is used as mass storage for programs and other data. The memory 114 is described in greater detail below.

The keyboard 104 and the mouse 106 provide input means to the processing means 110. Other devices such as CDROMS, DVD ROMS, scanners, etc. could be coupled to the system bus 118 and allow for storage of data, communication with other computers over a network, etc. Any such devices may then comprise further input means.

The I/O (Input/Output) subsystem 116 is arranged to receive inputs from the keyboard 104 and from the processing means 110 and may allow communication from other external and/or internal devices. The display driver 117 allows the processing means 110 to display information on the display 102.

The processing circuitry 108 further comprises a transmitting/receiving means 120, which is arranged to allow the processing circuitry 108 to communicate with a network. The transmitting/receiving means 120 also communicates with the processing circuitry 108 via the bus 118.

The processing circuitry 108 could have the architecture known as a PC, originally based on the IBMT™ specification, but could equally have other architectures. The processing circuitry 108 may be an APPLE™, or may be a RISC system, and may run a variety of operating systems (perhaps HP-UX, LINUX, UNIX, MICROSOFT™ NT, AIX™, or the like). The processing circuitry 108 may also be provided by devices such as Personal Digital Assistants (PDA's), mainframes, telephones, televisions, watches or the like.

It will be appreciated that although reference is made to a memory 114 it is possible that the memory could be provided by a variety of devices. For example, the memory may be provided by a cache memory, a RAM memory, a local mass storage device such as the hard disk 112, any of these connected to the processing circuitry 108 over a network connection such as via the transmitting/receiving means 120. However, the processing means 110 can access the memory via the system bus 118, accessing program code to instruct it what steps to perform and also to access the data samples. The processing means 110 then processes the data samples as outlined by the program code.

The memory 114 is used to hold instructions that are being executed, such as program code, etc., and contains a program storage portion 150 allocated to program storage. The program storage portion 150 is used to hold program code that can be used to cause the processing means 110 to perform predetermined actions.

The memory 114 also comprises a data storage portion 152 allocated to holding data and in embodiments of the present invention in particular holds a DSP model 154 and a scenario tree 164.

The computer system 100 of FIG. 1 is arranged to provide a suite of components 200 that together allow a Dynamic Stochastic Program (DSP) to be formulated and solved. In this embodiment there are five components which interact with one another as will be described hereinafter but in other embodiments there may be more or fewer components. The components may also be thought of modules within a program running on the computer system.

Every one of the components is utilised in the overall process of finding an acceptable solution to the DSP. However, bespoke variants of some of the components may be required to customize the suite to a particular application. The components are described below.

Finding a robust solution generally involves an iterative process of refining the planning problem, rerunning the simulations and the optimization, and interpreting the results. This process is described subsequently. It will be appreciated that when considering planning problems that involve uncertainty, now and in the future it is useful to consider that our present decisions are only based on what we know now, so our planning problems are roughly Markovian. Furthermore our forecasts of future scenarios branch outwards like a tree, one time-stage at a time. This nodal formulation makes decomposition solvers particularly efficient. Much more so than some other approaches that use a general-purpose solver for a flat scenario structure with non-anticipativity constraints.

Description of Components

The generator component 202 is the central component of the Suite 200 and generates the DSP from a model written in a proprietary programming language. It may be considered as a compiler that reads a program that is stored in a text file, combines it with the specified scenario structure, and generates an internal representation of the DEP that can be solved by a solver component 204 of the suite 200. The specific scenario structure is defined by a scenario tree 164 which is maintained within the memory 112, 114.

The DSP is represented as a tree in which each node of the tree represents a decision point at which the future must be assessed in terms of alternative future scenarios. This tree may be referred to as a scenario tree and a simulated scenario represents one particular path through the tree and as such represents one particular future prediction. It will be appreciated that many scenarios (i.e. paths through the tree) will contain the same branches and nodes and as such there will be redundancy in the scenarios. Some embodiments of the invention may utilise this redundancy and store portions of scenarios that are evaluated in order that that or those portions of a scenario need not be re-evaluated when further scenarios are evaluated.

The second function of the generator component 202 is to read the scenarios generated by a simulator component 206 into the structure required by the solver component 204 during the solving process. This can be a dynamic process, node by node of the nodal formulation of the scenario, which exploits the partitioning method that is embodied in one of a plurality of a plurality of solvers within the solver component 204. Some embodiments of the invention may utilise a number of solvers in sequentially. By this means planning problems that are too large to handle all at once can be broken down into manageable sub-tasks.

The second component of the Suite is the solver component 206, which comprises several decomposition solvers that are designed to exploit the particular characteristics of real-world DSP's. These characteristics reflect the ways in which uncertainty evolves in the future as discussed above.

Typically for any application there will be a number of processes and events that should be forecast in alternative scenarios of the future. The simulation component 206 comprises a set of simulators for financial and economic processes such as stocks, bonds, interest rates, cash flows, production and inflation. In the present embodiment an asset simulator 166 and a liability simulator 168 are provided. There are simulators for real-world processes such as the supply and demand for energy, oil, or telecommunications bandwidth. There are also simulators for real-world events such as sickness and death of individuals. These can be used or adapted to simulate all of the processes and events that are required for the particular planning problem at hand.

Throughout the modelling process it is desirable to inspect the input data and solver results in order to refine the scenario structure and thereby improve the robustness of the solution. This can be difficult without a graphical representation of the simulated scenarios and the conditional decisions found by the solver, which often comprise a vast amount of numerical data. The visualisation component 208 provides such a tool.

The visualisation component 208 consists of a selection of graphical viewers for scenario trees and solver results. These can display large distributions of scenarios in a way that helps the practitioner to see the overall shape and flow of the scenarios, without being buried in the fine detail. This is advantageous for successful control of the iterative modelling process.

The flexibility and customization capabilities of the Suite 200 are provided by a library component 210, a comprehensive library of routines for creating, editing, processing and viewing models, scenarios and solutions. With this library it is possible to customize the other components (the simulation component 206, the generator component 202, the solver component 204 and the visualisation component 208) to suit particular applications, such as financial portfolio management or asset and liability management. The library component 210 provides an Application Programming Interface (API) to many of the facilities of these other components, as well as a toolkit of other routines specific to DSP.

Figure 3:
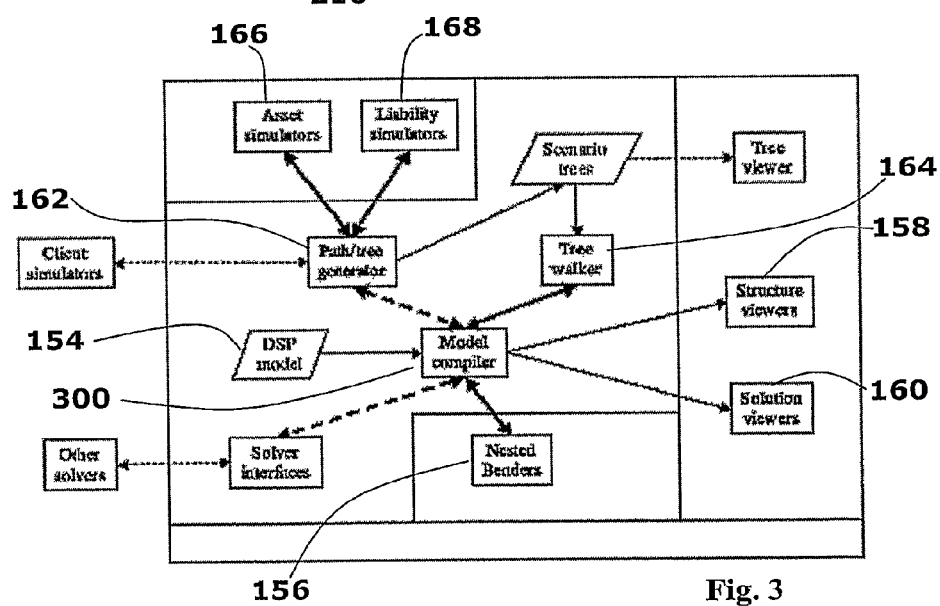
FIG. 3 schematically shows how units within the components communicate with one another.

Referring to FIG. 3 it can be seen that the various components of the Suite 200 communicate by means of procedure calls and data structures that are outlined below.

The generator component 202 comprises a model compiler 300 which is arranged to read the DSP model 154 from the memory 112, 114, compile it into the DEP, combines it with scenario data, and pass the program to the solver component 204. In this embodiment the solver component comprises a nested Benders solver 156. The nested bender solver 156 decomposes the problem using aggregation heuristics, and then solves the problem piece-wise with an adaptation of the nested Benders algorithm.

The internal structure of the DEP can be inspected by the visualisation component 208. In particular the visualisation component comprises a structure viewer 158 to determine the optimal form of the program for efficient solving. Once the planning problem is solved, the solution is passed back to the model compiler 300 where it can be inspected by means of solution viewers 160 provided by the visualisation component 208.

The model compiler 300 may, if required, create the DEP in the form of a text file that can be read by a solver other than the solver component 204, by means of the appropriate solver interface. Though flexible, this is constrained and inefficient for the reasons expressed above.

The model compiler 300 calls the path/tree generator 162 for each piece of the scenario tree 164 that is required by the solver component 204. The path/tree generator 162 in turn calls simulators 166, 168 provided by the simulation component 206 repeatedly to populate each node of the path or tree that has been requested.

The path/tree generator 162 can, if required, create an entire scenario tree 164 as a data file in depth-first pre-order that can be read by a tree walker 170, provided by the generator component 202, whilst solving. This scenario tree 164 can be displayed by a tree viewer 172 provided by the visualisation component 208.

Figure 2:
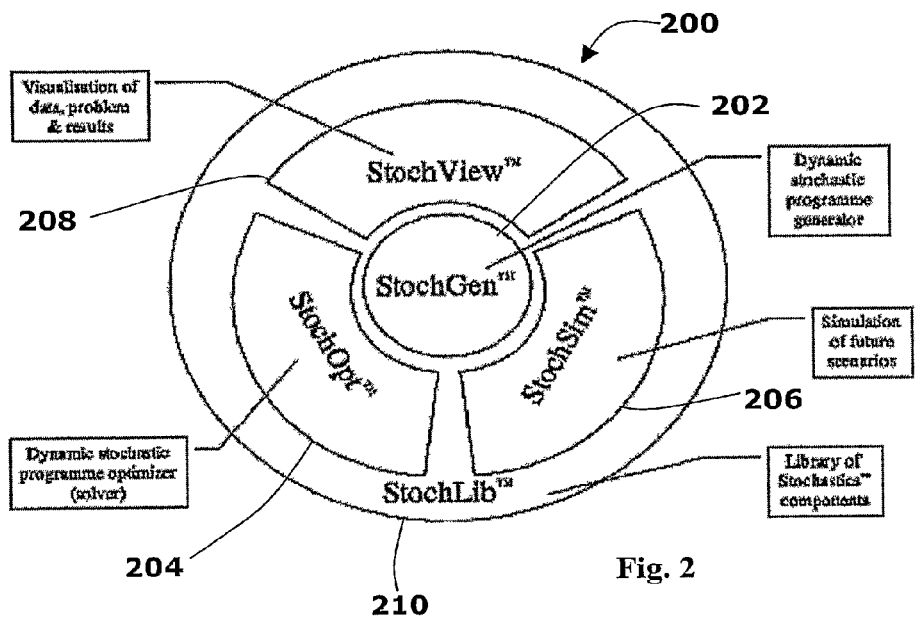
FIG. 2 schematically shows an overview of the components of one embodiment of the present invention.
Figure 4:
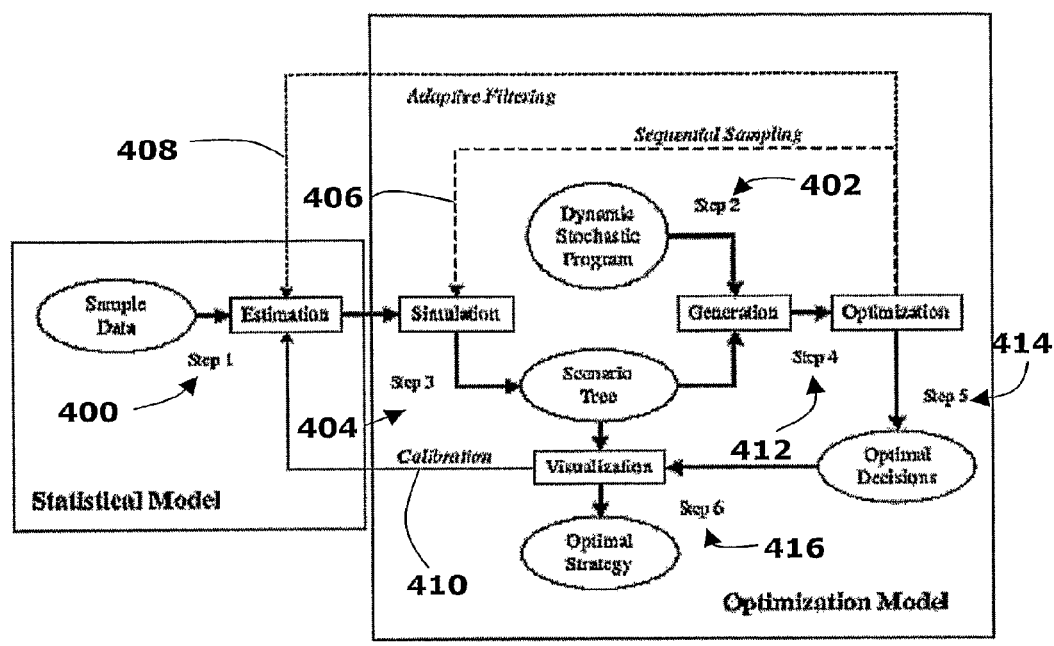
FIG. 4 outlines a method of using the invention as shown in FIGS. 1 and 2.

FIG. 4 provides a flow chart outlining use of the suite shown in FIGS. 1 to 3. This Figure illustrates how the iterative usage of embodiments of the Suite may be used to produce a robust solution for a planning problem. In the Figure, the process starts with the estimation of the stochastic processes. Step 1 400.

The practitioner starts the planning process by analysing the nature of the uncertainties or risks associated with his or her forecasts. (Obviously, if the future is known with certainty, then the plan is entirely deterministic and the problem is trivial.) Typically this involves estimating a number of stochastic processes, such as the price of stocks and bonds, or the lifespan and care needs of an individual, for instance. In other examples the stochastic processes may be simulators for real-world processes such as the supply and demand for energy, oil, or telecommunications bandwidth which may be used in the design of equipment and plant. For realism, these models are generally based on historic data samples. A variety of sophisticated statistical tools already exist that are capable of supporting this task.

Step 2 402.

The next step is to formulate the DSP using the modelling language. As described before, this is most conveniently and uniquely done by describing the problem in a mathematical form that is deterministic, without reference to the structure of the scenarios that will be generated. It suffices to identify which parameters are fixed and which are random. Of course the decision variables are random, and depend on the constraints and objectives that the practitioner specifies.

These constraints apply consistently throughout time, and without regard to the particular choice of scenario structure. This apparent loss of flexibility, which precludes non-anticipativity constraints for instance, is wholly consistent with the nature of the real-world problems for which DSP is appropriate using the Suite. The major benefit is in a compact representation of the planning problem that need not change with different scenario structures, unlike every other Stochastic Programming (SP) approach.

Step 3 404.

Once the DSP is formulated, and whilst it is being refined, the practitioner uses the simulation component 206 to simulate the scenarios that are required by the generator component 202 to compile the DSP into the DEP. In this embodiment the asset 166 and the liability 168 simulators are loaded with the parameters estimated in step 1 (400 in the Figure). It will be appreciated that there are a plurality of simulators in the simulation component 206 for assets such as stocks and bonds, financial factors such as interest and exchange rates, economic factors such as production and inflation, liabilities such as loans, mortgages and cash flows, and personal events such as sickness or death, together with other, technical and business related ideas.

Scenarios can be generated individually on demand by the generator component 202 whilst running the solver component 204, or pre-computed as (sub-)trees which are subsequently 'walked' by the tree walker 170 of the solver. The practitioner specifies the time steps and branching structure that are required for each modelling iteration. Typically one starts with a short tree that has few time steps and a low branching factor. But as the model 154 is refined, the number of time steps and branches may be increased, even creating asymmetric trees, in order to refine the solution and prove its robustness. This is done without the need to change the DSP.

Indeed, by means of the feedback loops shown in the FIG. 4 (a sequential sampling feedback loop 406, an adaptive filtering feedback loop 408 and a calibration feedback loop 410), it is possible for the suite of components 200 to refine the scenario structure iteratively in a semi-automatic fashion. Sequential sampling provided by the sequential sampling feedback loop 406 is a method of using data obtained from sequential importance sampling based on the expected value of perfect information from the solver to grow the scenario tree only in those areas that require further sampling, thus avoiding redundant input data and maintaining efficiency. Adaptive filtering allows the system to automatically update the model from basic data.

The calibration feedback loop 410 determines whether coefficients used in the DSP are changing more than may be expected. If this is the case then the DSP may be adjusted in order to reduce this greater than expected change.

Step 4 412.

With the DSP and scenario structure in place, the practitioner runs the generator component 202 to 'compile' the model. The generator component 202 may compile and run the DSP in batch mode, or it can interpret the programming language interactively in a terminal session. As an interpreter it not only provides feedback to assist the user with correct syntax, but it also allows the user to run the solver component 204 iteratively, so that he/she can modify and extend the DSP based on the results (or lack of them) from the solver component 204.

This interactive mode is useful for rapid prototyping and development of sophisticated DSP's. Note that other stochastic programming extensions of third-party mathematical programming languages, unlike the programming language used by embodiments of the current invention, rely on a pre-processing step in compiling these extensions. This means that they do not have this interactive interpretive capability, but can only be used in a more tedious batch mode.

Furthermore, the programming language used by embodiments of the current invention has specialised extract, display and print commands that can read the results from the solver component 204 and report statistical information about the solution, such as expected values and distributions spanning some, or all, of the scenarios. This capability is not built into other systems, where the scenarios have to be hard-coded, but is convenient for embodiments of the invention providing this feature.

Step 5 414.

The user invokes the solver component 204, either interactively or in batch mode, with the 'solve' command, just as with any other mathematical programming language. Unlike any other stochastic programming extension, the generator component 202 invokes the solver component 204 directly, writing to and reading from the internal data structures of the solver component 204. In embodiments in which this feature is provided the responsiveness of the system as a whole is increased. Other stochastic systems, which pass a textual representation of the DEP to another process for it to compile and run do not have this advantage.

The solver computes an optimal solution to the DEP, compiled from the DSP and the scenario tree (unless the problem is infeasible because of the constraint set of course). As explained earlier, the solver component 204 can compute solutions to real-world problems ten to a hundred times faster than other general-purpose solvers. Which is just as well, because this optimal solution is more or less dependent on the particular set of scenarios generated by the simulators provided by the simulation component 206. A different sample set will produce a solution that is more or less different. Whether the differences are significant is the subject of subsequent analysis.

Typically the practitioner will use the suite of components 200 to repeatedly modify the scenario structure to find a balance between the time it takes to solve the problem and the accuracy of the solution. Having found that balance, they may go on to run the model with many different scenario samples to establish the variance of the results. In this respect dynamic stochastic programming is different from deterministic programming: a highly iterative process, rather than right-first-time.

Step 6 416

At each iteration of the model, the practitioner may evaluate the solver's solution for its realism. Given that the solution may comprise very large numbers of individual forward decisions (the variables at each node of the scenario tree), it is essential to gain an impression of the shape and flow of the solution and its fitness for purpose. It involves comparing the input scenarios (the tree and its branches) with the resulting solution (on average and in distribution). One may view the solution as the equivalent of a decision tree with continuous variables. The term forward decision has been used as the decision must be assessed at a point in time that is in the future.

This may be better done visually with the visualisation component 208 rather than numerically from the solver component 204. An advantage of embodiments in which the visualisation component 208 is used rather than the solver component 204 is that the user can quickly spot anomalies and inconsistencies, faulty decision logic, inappropriate outliers, etc. Then they may be able to drill down into the data to diagnose the issue, and correct either the program or the scenario structure. If the issue lies with the simulations, then these can be re-calibrated with feedback from previous iterations of the model.

Perhaps because stochastic programs have in the past been unrealistically small, other systems have not integrated graphical tools. Previous approaches have sometimes made use of third-party graphics packages, but only ad hoc to illustrate some aspect of a particular problem, not as an integral part of the modelling process. The integrated visualisation component 208 of the suite of components 200 is unique in the field of DSP.

An example of a suite of components 200 suitable for providing the present invention is provided by Cambridge System Associates Ltd. of 1 Earl Street, Cambridge, CB1 1JR. In this particular suite the generator component 202 is referred to as StochGen™, the solver component 204 is referred to as StochOpt™, the simulation component 206 is referred to as StochSim™ the visualisation component 208 is referred to as StochView™ and the library component 210 is referred to as StochLib™.

Example of DSP

```
# Pioneer CALM Model
# Initial structure
# Define the timebase

# Note that there is no need to define the set of nodes
# in the scenario tree, nor to define their predecessors,
# as would be necessary in other programming languages.

param horizon;
set times := 0..horizon;
set start_times := 0..(horizon−1);
set mean_times := 1..(horizon−1);
set end_times := 1..horizon;
# Define the assets & currencies

set assets;
set currencies;
param initial_assets{assets};
param initial_cash;
# Define transaction costs

param cost;
param sell_cost := 1 − cost;
param buy_cost := 1 + cost;
# Define portfolio constraint parameters

param min_asset{assets};
param max_asset{assets};
param max_turnover{assets};
param max_borrow{currencies};
param max_deposit{currencies};
# Get the fixed parameter data and scenario tree-string

# Note that the tree-string is in an include file, so that
# it can be changed at will without changing the program

```

-continued

```
data "Pioneer.data";
include "Pioneer.trst";
# Define stochastic rates of return, interest & exchange

# Here is the first major departure from other programming
# languages... there is no need to declare large arrays of
# scenario data, node by node

# The reference to the simulator data is sufficient for
# the model compiler to create the DEP at runtime

param asset_return{times,assets} simulator datasim
  "returns.siml";
param asset_exchange{times,assets} simulator datasim
  "exchange.siml";
param deposit_rate{times,currencies} simulator datasim
  "deposit.siml";
param borrow_rate {times,currencies} simulator datasim
  "borrow.siml";
param foreign_exchange{times,currencies} simulator datasim
  "exchange.siml";
# Define asset amounts as decision variables, split into
# bought & sold

# Notice that the variables are assigned to stages, so
# that the compiler can declare the corresponding
# variables in the nodes of the DEP, according to the
# treestring

# Again, this avoids the need for large variable arrays,
# indexed by node as well as time and asset

var asset_amount{t in start_times, assets} stage t;
var asset_bought{t in start_times, assets} stage t, >=0;
var asset_sold{t in start_times, assets} stage t, >=0;
s.t. initial_rebalance_c{a in assets}:
  asset_amount[0,a] = initial_assets[a] + asset_bought[0,a] −
  asset_sold[0,a];
s.t. asset_rebalance_c{t in mean_times, a in assets}:
  asset_amount[t,a] = asset_amount[t−1,a] *
  (1 + asset_return[t,a]) + asset_bought − asset_sold[t,a];
# Define currency amounts as decision variables, split into
deposit & borrow

var currency_amount{t in start_times, currencies} stage t;
var currency_deposit{t in start_times, currencies} stage t, >=0;
var currency_borrow{t in start_times, currencies} stage t, >=0;
# Balance the source and use of cash

var cash_sources{t in start_times} stage t, >=0;
var cash_uses{t in start_times} stage t, >=0;
# Notice that none of the constraints need take account
# of the scenario structure

# Other programming languages would need the constraints
# indexed by node as well as time

s.t. initial_cash_sources_t:
  cash_sources[0] = initial_cash + sell_cost * sum{a in assets}
  asset_exchange[0,a] * asset_sold[0,a] + sum{c in currencies}
  foreign_exchange[0,c] * currency_borrow[0,c];
s.t. cash_sources_t{t in mean_times}:
  cash_source[t] = sell_cost * sum{a in assets} asset_exchange[t,a] *
  asset_sold[t,a] + sum{c in currencies} foreign_exchange[t,c] *
  (currency_borrow[t,c] + currency_deposit[t−1,c] *
  (1 + deposit_rate[t,c]));
s.t. initial_cash_uses_t:
  cash_uses[0] = buy_cost * sum{a in assets} asset_exchange[0,a] *
  asset_bought[0,a] + sum{c in currencies } foreign_exchange[0,c] *
  currency_deposit[0,c];
s.t. cash_uses_t{t in mean_times}:
  cash_uses[t] = buy_cost * sum{a in assets} asset_exchange[t,a] *
  asset_bought[t,a] + sum{c in currencies} foreign_exchange[t,c] *
  (currency_deposit[t,c] + currency_borrow[t−1,c] *
  (1 + borrow_rate[t,c]));
s.t. cash_balance_c{t in start_times}:
  cash_sources[t] = cash_uses[t];
# Define the wealth terms, before and after rebalancing

```

-continued

```
# Once again, there is no need to index by node

var wealth_before{t in end_times} stage t, > =0;
var wealth_after{t in start_times} stage t;
s.t. wealth_before_c{t in end_times}:
   wealth_before[t] = sum{a in assets} asset_exchange[t,a] *
   asset_amount[t-1,a] * (1 + asset_return[t,a]) + sum{c in currencies}
   foreign_exchange[t,c] * (currency_deposit[t-1,c] *
   (1 + deposit_rate[t,c] - currency_borrow[t-1,c] *
   (1 + borrow_rate[t,c]));
s.t. wealth_after_c{t in start_times}:
   wealth_after[t] = sum{a in assets} asset_exchange[t,a] *
   asset_amount [t,a]+ sum{c in currencies} foreign_exchange[t,c] *
   (currency_deposit[t,c] - currency_borrow[t,c]);
# Define the CARA utility objective

# Note we use the expected value of a stochastic variable,
# which would have to be calculated as the average across
# nodes in other languages

# This is a proprietary feature of the
# programming language

minimize cara_utility_o:
   sum{t in end_times} exp(-wealth_before[t]);
#Set the portfolio constraints

s.t. min_asset_c{t in start_times, a in assets}:
   asset_exchange[t,a] * asset_amount[t,a] > = min_asset[a];
s.t. max_asset_c{t in start_times, a in assets}:
   asset_exchange[t,a] * asset_amount[t,a] < = max_asset[a] *
   wealth_after[t];
s.t. max_turnover_c1{t in mean_times, a in assets}:
   asset_exchange[t,a] * asset_amount[t,a] - asset_exchange[t-1,a] *
   asset_amount[t-1,a] < = max_turnover[a] * wealth_after[t];
s.t. max_turnover_c2{t in mean_times, a in assets}:
   asset_exchange[t,a] * asset_amount[t,a] - asset_exchange[t-1,a] *
   asset_amount[t-1,a] > = -max_turnover[a] * wealth_after[t];
s.t. max_borrow_c{t in start_times, c in currencies}:
   foreign_exchange[t,c] * currency_borrow[t,c] < = max_borrow[c];
s.t. max_deposit_c{t in start_times, c in currencies}:
   foreign_exchange[t,c] * currency_deposit[t,c] < = max_deposit[c] *
   wealth_after[t];
# Solve the program

solve;
# Display the results

# This uses features of the StochGen (i.e. the generator component)
compiler
# to display the expectation across multiple scenarios,
# and the individual results by scenario

# Notice that it does not need to be indexed by node or
# scenario, as would be the case in other languages

displaye wealth_before[horizon];
displaystoc wealth_before[horizon];
displaye{a in assets}:
   asset_exchange[horizon,a] * asset_amount[horizon-1,a] *
   (1 + asset_return[horizon,a]);
displaye{c in currencies}:
   foreign_exchange[horizon,c] * (currency_deposit[horizon-1,c] *
   (1 + deposit_rate[horizon,c]) - currency_borrow[horizon-1,c] *
   (1 + borrow_rate[horizon,c]));
# End of program

# Crucially, this program is much simpler and much
# shorter than the equivalent in any other mathematical
# programming language

# Furthermore, it need not be changed at all to recompute
# a solution with a different set of scenarios, or even a
# different scenario tree
```

What is claimed is:

1. A computer-implemented method of iteratively seeking a solution to a Dynamic Stochastic Programming (DSP) problem written in a Dynamic Stochastic Programming (DSP) modeling language, comprising:
   representing the DSP problem as a deterministic dynamic model written in the DSP modeling language together with generating data in a scenario tree to represent the DSP problem comprising a plurality of nodes each representing a decision point at which the future is to be assessed; and
   using the DSP modeling language, and a solver component, each arranged to process compatible data structures to:
      iteratively solve the DSP problem using a plurality of modeling iterations to generate solutions to the DSP problem, by:
         automatically specifying the scenario tree structure in terms of an input time step by determining a branching structure for the nodes of the scenario tree in terms of a number of time steps between branch points and the number of branches for each branch point to minimize the number of scenarios in the tree needed to represent the DSP problem;
         growing the scenario tree in areas that require further sampling by utilising data obtained from sequential importance sampling;
         modifying the structure of the scenario tree responsive to a time that it takes to solve the DSP problem and an accuracy of the solution;
         compiling the DSP problem and the scenario tree into a Deterministic Equivalent Problem (DEP);
         invoking a solver within the solver component appropriate to the deterministic dynamic model to generate a solution to the DEP, where the DSP modeling language evaluates the generated solution at each node of the successively generated scenario tree to identify an optimal solution to the DSP problem; and
      output the optimal solution to the DSP problem.

2. The method of claim 1 wherein the DSP problem is specified in terms of decisions between pairs of branch points, to be made at a first branch point of the pair and which is determined in terms of expectation across scenarios.

3. The method of claim 1 wherein the scenario tree is generated such that nodes represent random entries within the deterministic dynamic model.

4. The method of claim 1 wherein the iterative solving of the DSP problem applies a statistical scenario generated from a simulation component appropriate to the deterministic dynamic model.

5. The method of claim 1 wherein decisions are generated at each iteration of the iterative solving of the DSP problem which are evaluated with respect to the required accuracy of solution.

6. The method of claim 1 wherein at least one of the optimal solution to the DSP problem and the deterministic dynamic model used as the input is output to a visualization component for viewing.

7. The method of claim 1 wherein at least one feedback loop is used to determine which areas of the tree should be grown.

8. The method of claim 1 wherein the DSP modeling language reads to and writes from internal data structures of the chosen solver.

9. A computer system for iteratively seeking a solution to a Dynamic Stochastic Programming (DSP) problem written in a Dynamic Stochastic Programming (DSP) modeling language, comprising:

a computer processor for executing computer program instructions; and a non-transitory computer-readable storage medium for storing computer program instructions executable to perform steps comprising:

representing the DSP problem as a deterministic dynamic model written in the DSP modeling language together with generating data in a scenario tree to represent the DSP problem comprising a plurality of nodes each representing a decision point at which the future is to be assessed; and using the DSP modeling language, and a solver component, each arranged to process compatible data structures to:

iteratively solve the DSP problem using a plurality of modeling iterations to generate solutions to the DSP problem, by:

automatically specifying the scenario tree structure in terms of an input time step by determining a branching structure for the nodes of the scenario tree in terms of a number of time steps between branch points and the number of branches for each branch point to minimize the number of scenarios in the tree needed to represent the DSP problem;

growing the scenario tree in areas that require further sampling by utilising data obtained from sequential importance sampling;

modifying the structure of the scenario tree responsive to a time that it takes to solve the DSP problem and an accuracy of the solution;

compiling the DSP problem and the scenario tree into a Deterministic Equivalent Problem (DEP);

invoking a solver within the solver component appropriate to the deterministic dynamic model to generate a solution to the DEP, where the DSP modeling language evaluates the generated solution at each node of the successively generated scenario tree to identify an optimal solution to the DSP problem; and output the optimal solution to the DSP problem.

10. The system of claim 9 wherein the DSP problem is specified in terms of decisions between pairs of branch points, to be made at a first branch point of the pair and which is determined in terms of expectation across scenarios.

11. The system of claim 9 wherein the scenario tree is generated such that nodes represent random entries within the deterministic dynamic model.

12. The system of claim 9 wherein the iterative solving of the DSP problem applies a statistical scenario generated from a simulation component appropriate to the deterministic dynamic model.

13. The system of claim 9 wherein decisions are generated at each iteration of the iterative solving of the DSP problem which are evaluated with respect to the required accuracy of solution.

14. The system of claim 9 wherein at least one of the optimal solution to the DSP problem and the deterministic dynamic model used as the input is output to a visualization component for viewing.

15. The system of claim 9 wherein at least one feedback loop is used to determine which areas of the tree should be grown.

16. The system of claim 9 wherein the DSP modeling language reads to and writes from internal data structures of the chosen solver.

17. A non-transitory computer-readable storage medium for storing computer program instructions executable to perform steps comprising:

representing the DSP problem as a deterministic dynamic model written in the DSP modeling language together with generating data in a scenario tree to represent the DSP problem comprising a plurality of nodes each representing a decision point at which the future is to be assessed; and using the DSP modeling language, and a solver component, each arranged to process compatible data structures to:

iteratively solve the DSP problem using a plurality of modeling iterations to generate solutions to the DSP problem, by:

automatically specifying the scenario tree structure in terms of an input time step by determining a branching structure for the nodes of the scenario tree in terms of a number of time steps between branch points and the number of branches for each branch point to minimize the number of scenarios in the tree needed to represent the DSP problem;

growing the scenario tree in areas that require further sampling by utilising data obtained from sequential importance sampling;

modifying the structure of the scenario tree responsive to a time that it takes to solve the DSP problem and an accuracy of the solution;

compiling the DSP problem and the scenario tree into a Deterministic Equivalent Problem (DEP);

invoking a solver within the solver component appropriate to the deterministic dynamic model to generate a solution to the DEP, where the DSP modeling language evaluates the generated solution at each node of the successively generated scenario tree to identify an optimal solution to the DSP problem; and output the optimal solution to the DSP problem.

18. The medium of claim 17 wherein the DSP problem is specified in terms of decisions between pairs of branch points, to be made at a first branch point of the pair and which is determined in terms of expectation across scenarios.

19. The medium of claim 17 wherein the scenario tree is generated such that nodes represent random entries within the deterministic dynamic model.

20. The medium of claim 17 wherein the iterative solving of the DSP problem applies a statistical scenario generated from a simulation component appropriate to the deterministic dynamic model.

21. The medium of claim 17 wherein decisions are generated at each iteration of the iterative solving of the DSP problem which are evaluated with respect to the required accuracy of solution.

22. The medium of claim 17 wherein at least one of the optimal solution to the DSP problem and the deterministic dynamic model used as the input is output to a visualization component for viewing.

23. The medium of claim 17 wherein at least one feedback loop is used to determine which areas of the tree should be grown.

24. The medium of claim 17 wherein the DSP modeling language reads to and writes from internal data structures of the chosen solver.

* * * * *